United States Patent
Prentice et al.

(10) Patent No.: US 10,481,218 B2
(45) Date of Patent: Nov. 19, 2019

(54) PROVIDING INFORMATION ABOUT A TARGET OBJECT IN A FORMATTED OUTPUT SIGNAL

(71) Applicant: Allegro MicroSystems, LLC, Manchester, NH (US)

(72) Inventors: Seth Prentice, Epping, NH (US); Michael Finneman, Lebanon, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 183 days.

(21) Appl. No.: 15/695,109

(22) Filed: Sep. 5, 2017

(65) Prior Publication Data
US 2018/0067174 A1     Mar. 8, 2018

Related U.S. Application Data

(60) Provisional application No. 62/384,781, filed on Sep. 8, 2016.

(51) Int. Cl.
| | | |
|---|---|---|
| *G01R 33/07* | (2006.01) | |
| *H03K 5/08* | (2006.01) | |
| *H03K 7/08* | (2006.01) | |
| *G08B 25/04* | (2006.01) | |

(52) U.S. Cl.
CPC .............. *G01R 33/07* (2013.01); *H03K 5/08* (2013.01); *H03K 7/08* (2013.01); *G08B 25/045* (2013.01)

(58) Field of Classification Search
CPC ........... G01R 33/07; G01P 21/02; H03K 7/08; H03K 5/08; G08B 25/045
See application file for complete search history.

(56) References Cited

U.S. PATENT DOCUMENTS

| | | |
|---|---|---|
| 6,492,804 B2 | 12/2002 | Tsuge et al. |
| 6,542,847 B1 | 4/2003 | Lohberg et al. |
| 6,687,644 B1 | 2/2004 | Zinke et al. |
| 6,815,944 B2 | 11/2004 | Vig et al. |
| 7,026,808 B2 | 4/2006 | Vig et al. |
| 7,184,876 B2 | 2/2007 | Teulings et al. |
| 8,624,588 B2 | 1/2014 | Vig et al. |
| 8,860,404 B2 | 10/2014 | Dwyer et al. |

(Continued)

FOREIGN PATENT DOCUMENTS

| | | |
|---|---|---|
| DE | 19650935 A1 | 6/1998 |
| DE | 19911774 A1 | 12/1999 |

(Continued)

OTHER PUBLICATIONS

Gary Pepka, Magnetic Sensor ICs Offer Integrated Diagnostics for ASIL Compliance, p. 2, Fig. 2, Allegro MicroSystems, LLC, Feb. 2014 (Year: 2014).*

(Continued)

*Primary Examiner* — Daniel R Miller
(74) *Attorney, Agent, or Firm* — Daly, Crowley, Mofford & Durkee, LLP

(57) ABSTRACT

In one aspect, an integrated circuit (IC) includes a sensor. The sensor includes a processor configured to provide speed and/or direction of a target object based on the speed of the target object; monitor for a diagnostic fault; provide information if the diagnostic fault is detected; monitor for critical faults; and provide information if a critical fault is detected and the sensor recovers from the critical fault.

33 Claims, 15 Drawing Sheets

(56) References Cited

U.S. PATENT DOCUMENTS

| | | |
|---|---|---|
| 8,994,369 B2 | 3/2015 | Vig et al. |
| 9,068,859 B2 | 6/2015 | Dwyer et al. |
| 9,151,771 B2 | 10/2015 | Vig et al. |
| 9,222,990 B2 | 12/2015 | Dwyer et al. |
| 9,664,748 B2 | 5/2017 | Friedrich et al. |
| 2014/0210641 A1* | 7/2014 | Hammerschmidt ... G08C 19/16 340/870.19 |
| 2015/0268263 A1 | 9/2015 | Rasbornig |
| 2016/0214583 A1 | 7/2016 | Trapp et al. |
| 2016/0231141 A1 | 8/2016 | Endres et al. |
| 2017/0219662 A1 | 8/2017 | Prentice et al. |

FOREIGN PATENT DOCUMENTS

| | | |
|---|---|---|
| DE | 19634714 B4 | 8/2007 |
| DE | 10 2014 217834 A1 | 3/2016 |
| EP | 0944888 B1 | 10/2001 |
| JP | 2001/505691 A | 4/2001 |
| JP | 4142109 B2 | 8/2008 |
| WO | WO 9825148 A2 | 6/1998 |

OTHER PUBLICATIONS

A1334, Precision Hall-Effect Angle Sensor IC, Allegro Microsystems, LLC, initial release Oct. 2014 (Year: 2014).*
International Preliminary Report on Patentability dated Mar. 21, 2019 for International Application No. PCT/US2017/050014; 11 Pages.
PCT International Search Report and Written Opinion dated Nov. 27, 2017 for International Application No. PCT/US2017/050014; 16 Pages.
U.S. Appl. No. 15/655,403, filed Jul. 20, 2017, Doogue et al.
U.S. Appl. No. 15/655,400, filed Jul. 20, 2017, Doogue et al.
U.S. Appl. No. 15/655,390, filed Jul. 20, 2017, Pepka et al.
U.S. Appl. No. 15/655,383, filed Jul. 20, 2017, Kerdraon et al.
U.S. Appl. No. 15/655,377, filed Jul. 20, 2017, Kerdraon et al.
U.S. Appl. No. 15/596,514, filed May 16, 2017, Burdette et al.
U.S. Appl. No. 15/350,400, filed Nov. 14, 2016, Fernandez.
U.S. Appl. No. 62/384,781, filed Sep. 8, 2016, Prentice et al.

* cited by examiner

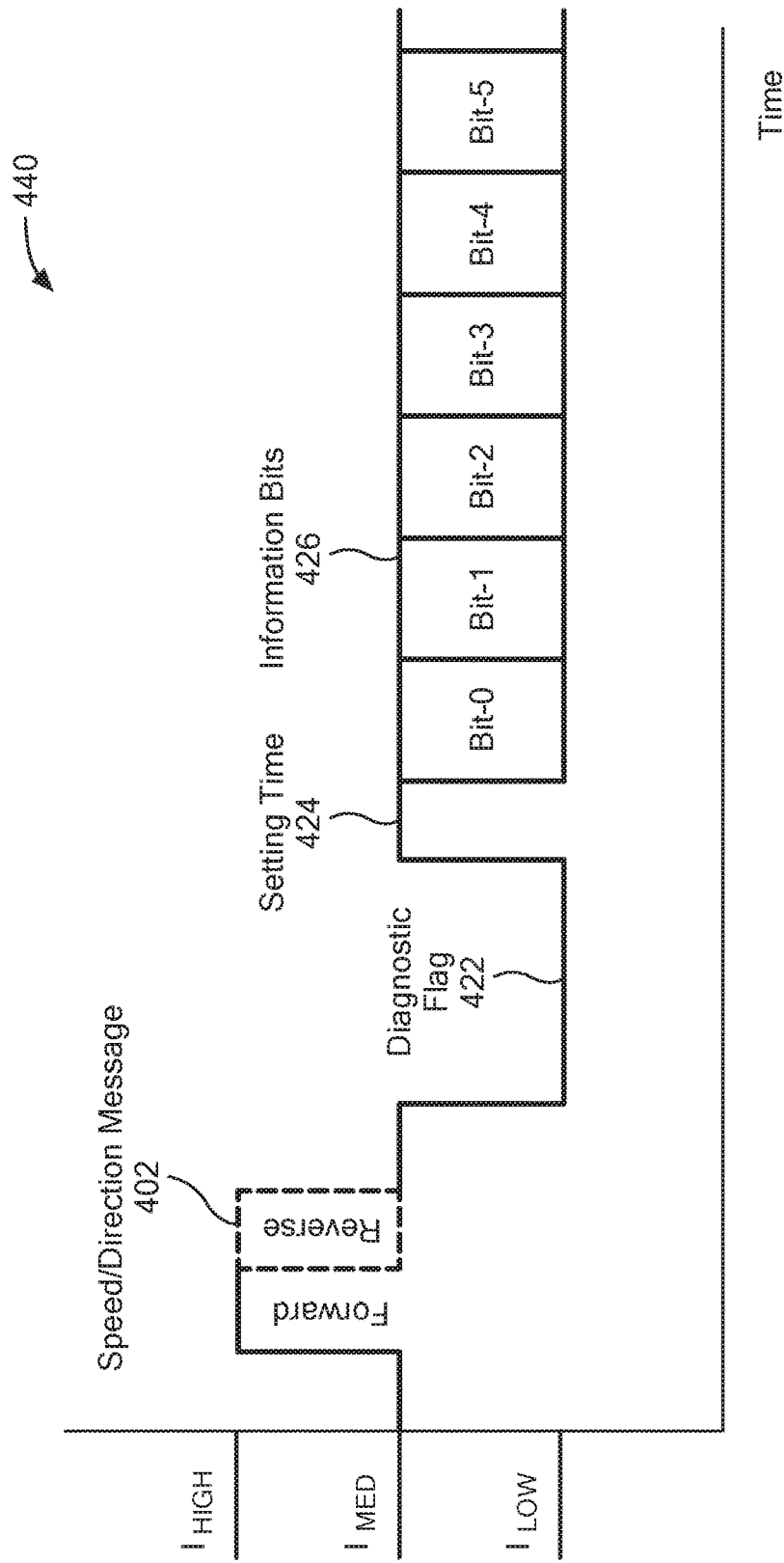

| Diagnostic Bits | | | Flag Description |
|---|---|---|---|
| 0 | 0 | 0 | No Error |
| 0 | 0 | 1 | Safety Goal 1 |
| 0 | 1 | 0 | Safety Goal 2 |
| 1 | 0 | 0 | Safety Goal 3 |
| 1 | 1 | 1 | Reserved |

| Signal Integrity Bits | | Flag Description |
|---|---|---|
| 0 | 0 | No Issue |
| 0 | 1 | Marginal Signal |
| 1 | 0 | At Signal Limit |
| 1 | 1 | Vibration Flag |

US 10,481,218 B2

PROVIDING INFORMATION ABOUT A TARGET OBJECT IN A FORMATTED OUTPUT SIGNAL

RELATED APPLICATIONS

This application claims the benefit of U.S. Provisional Application No. 62/384,781, filed Sep. 8, 2016, and entitled "PROVIDING INFORMATION ABOUT A TARGET OBJECT IN A FORMATTED OUTPUT SIGNAL," which is incorporated herein by reference in its entirety.

BACKGROUND

As is known in the art, sensors can be used in various types of devices to measure and monitor properties of systems in a wide variety of different applications. For example, sensors have become common in products that rely on electronics in their operation, such as automobile control systems. Common examples of automotive applications are the detection of ignition timing from an engine crankshaft and/or camshaft, the detection of wheel speed for anti-lock braking systems and four-wheel steering systems and speed and direction of transmission input and output gears.

As is also known, sensors can use serial communication to send data in the form of a stream of pulses or bits over a communication channel or to a computer or other processing system. Typically, each pulse stream conveys a limited amount of data.

SUMMARY

In one aspect, an integrated circuit (IC) includes a sensor. The sensor includes a processor configured to provide speed and/or direction of a target object based on the speed of the target object; monitor for diagnostic faults; provide information if a diagnostic fault is detected; monitor for critical faults; and provide information if a critical fault is detected and the sensor recovers from the critical fault.

In another aspect, a method includes providing speed and/or direction of a target object based on the speed of the target object; monitoring for a diagnostic fault; providing information if the diagnostic fault is detected; monitoring for critical faults; and providing information if a critical fault is detected and a sensor recovers from the critical fault.

In a further aspect, an integrated circuit (IC) includes a means to provide speed and/or direction of a target object based on the speed of the target object; monitor for a diagnostic fault; provide information if the diagnostic fault is detected; monitor for critical faults; and provide information if a critical fault is detected and the sensor recovers from the critical fault.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

FIGS. 4A to 4C are timing windows when a target object is at a low speed;

DETAIL DESCRIPTION

Described herein are techniques to provide information (e.g., speed and direction) about a target object and diagnostic information in a formatted output signal (sometimes referred to herein as a protocol). In one example, the formatted output signal may include speed and direction of a target within one pulse. In another particular example, the formatted output signal may be configured to only include data bits when there is a diagnostic flag. In one example, a speed and direction pulse is not directly coupled to diagnostic bit timing. That is, diagnostic information can be communicated at any time a diagnostic flag is detected. In some examples, if both speed and diagnostic information is detected simultaneously then first the speed and direction information is communicated followed by a settling time and then the diagnostic flag and bits are transmitted. In one example, the formatted output signal may provide diagnostic information after a critical failure. In one example, the formatted output signal may provide signal integrity information of the sensors front end such as for example, identifying if a signal from a sensor is attenuated, identifying if the signal of the sensor is coupled to noise, identifying if the signal of the sensor is offset and so forth. In one particular example, the formatted output signal may be a word of 5-bits+1 parity bit, which allows higher frequencies without truncation. In another particular example, none, part or all of the information bits (e.g., diagnostic bits, system integrity bits) may be selected to be received.

Within the protocol described herein, there can be multiple modes and each mode can provide different detail levels of diagnostic information. In some examples, it may be desirable to provide only a diagnostic flag at higher frequencies (speeds), communicate only diagnostic flags and suppress the information bits and communicate only portions of the information bits. Within the diagnostic flags there can be multiple levels diagnostic errors, for example, soft failures and critical failures. For these examples, the pulse width of the diagnostic flag can be changed to identify the type of diagnostic error. Further, in the case of multiple diagnostic flags, the data bits following can provide different data depending on the diagnostic flag type. In some examples, true unrecoverable critical failures can occur and the output would be at or between preset DC threshold(s), identifying an unrecoverable critical failure. Within the data word the final transmitted bit may contain a parity bit. The information bits may contain, ASIL (Automotive Safety Integrity Level) diagnostic information, sensor front end signal integrity information, target vibration information, sub-circuit diagnostic information, software algorithm failures/resets.

Figure 1A:
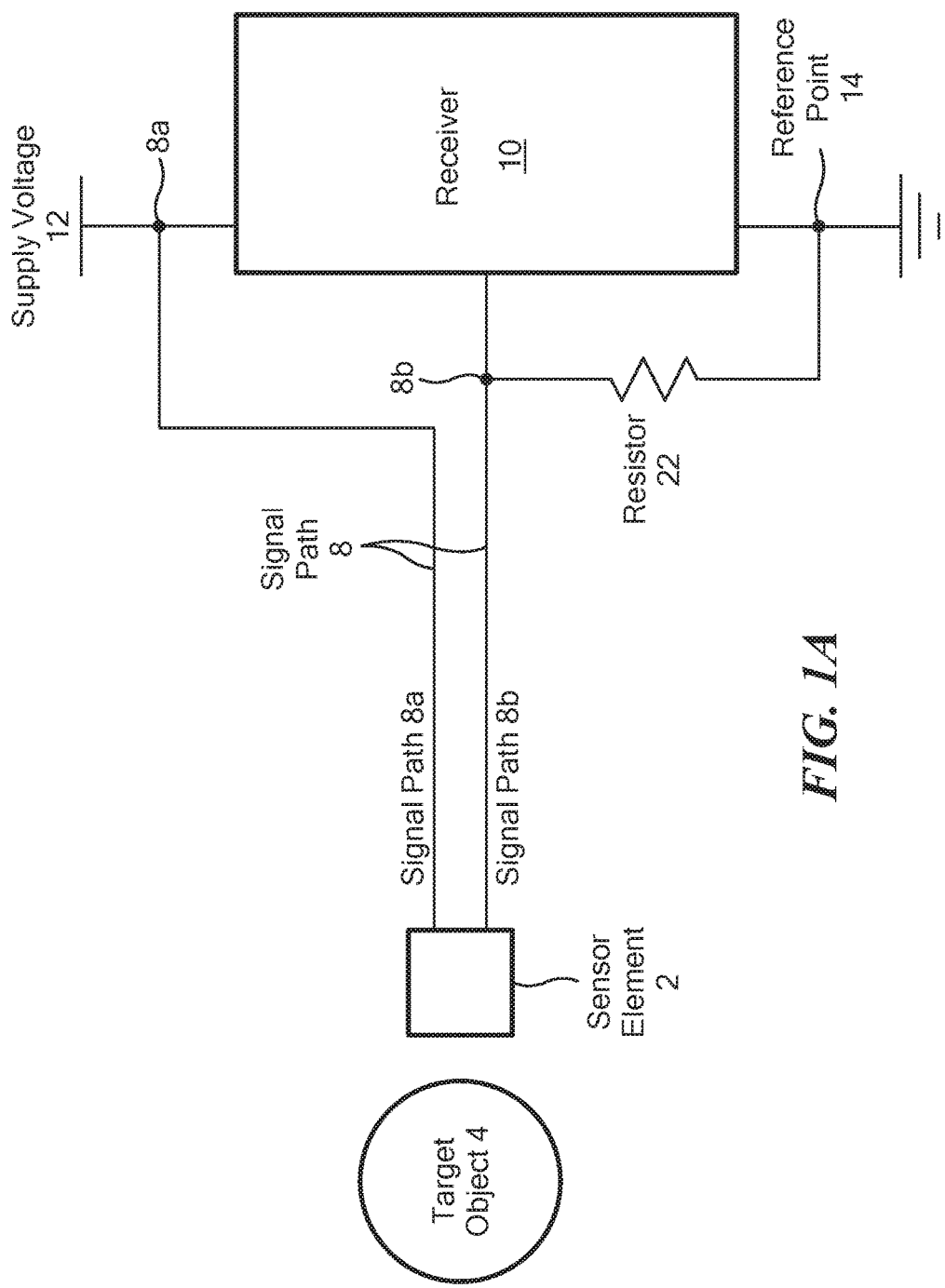
FIG. 1A is a block diagram of a system having a sensor disposed proximate to a target object.

Referring to FIG. 1A, a sensor 2 is disposed proximate a target object 4. In response to movement of the target object 4, the sensor 2 may generate a series of pulses, referred to herein as a pulse train, the characteristics and benefits of which will be described herein. The sensor 2 may be the same as or similar to the types described in each of U.S. Pat. No. 6,815,944, filed on Oct. 29, 2002, U.S. Pat. No. 7,026,808, filed on Sep. 23, 2004, U.S. Pat. No. 8,624,588, filed on Jul. 31, 2008, U.S. Pat. No. 9,151,771, filed on Dec. 2, 2013, U.S. Pat. No. 8,994,369, filed on Dec. 2, 2013, and U.S. Pat. No. 8,754,640, filed on Jun. 18, 2012, all of which are incorporated herein by reference in their entireties.

As used herein, the term "sensor" is used to describe a circuit that uses a magnetic field sensing element, generally in combination with other circuits. Sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the sensor is used in combination with a back-biased or other magnet, and a sensor that senses a magnetic field density of a magnetic field.

Signal paths 8a, 8b (collectively referred to herein as signal path 8) couple the sensor 2 to a receiver 10. In some embodiments, the signal paths 8a, 8b couple a supply voltage 12 and a reference point (e.g., ground) 14 to the sensor 2 as will be described further herein. In the illustrative embodiment of FIG. 1A, the signal path 8 is shown provided as a two-wire line 8a, 8b although any signal path or transmission line suitable for transmission of a pulse train from the sensor 2 to the receiver 10 may be used. The output signal pulse train generated by the sensor 2 is appropriate for use in two-wire, three-wire or n+1 wire sensor solutions.

The sensor 2 is disposed within a predetermined distance from the target object 4 to detect characteristics and features of the target object 4, such as speed and direction information. The particular positioning of the sensor 2 with respect to the target object 4 will depend upon the needs of a particular application or system in which the sensor 2 is being used.

In some examples, the sensor 2 may be adapted (and in some cases, optimized) for use in a wide variety of different applications including, but not limited to, accelerometer applications, gyroscope applications, gas sensor applications, pressure sensor applications, temperature sensor applications, bolometer sensor applications, infrared sensor applications and automotive applications. The sensor 2 may detect a condition of an environment in which the sensor is disposed (e.g. a condition experienced by the sensor 2) and generate the output signal pulse train to provide information corresponding to this condition. For example, in some embodiments, the detected condition is a change in a magnetic field. In other embodiments, the detected condition includes at least one of: a change in temperature, a change in pressure, a change in a gas level, a change in a radiation level or a change in a change in speed. The output signal pulse train may be initiated by a change in the condition that falls below or above a predetermined threshold or outside a predetermined acceptable range of values. For example, a temperature experienced by the sensor 2 may fall below or above a predetermined threshold or a pressure experienced by the sensor 2 may fall below or above a predetermined threshold. In response, the sensor 2 may generate the output signal pulse train to indicate this change in condition. In some embodiments, the sensor 2 may generate the output signal pulse train as part of a built-in test (BIT) or in response to a test probe applied to a particular device.

Figure 1B:
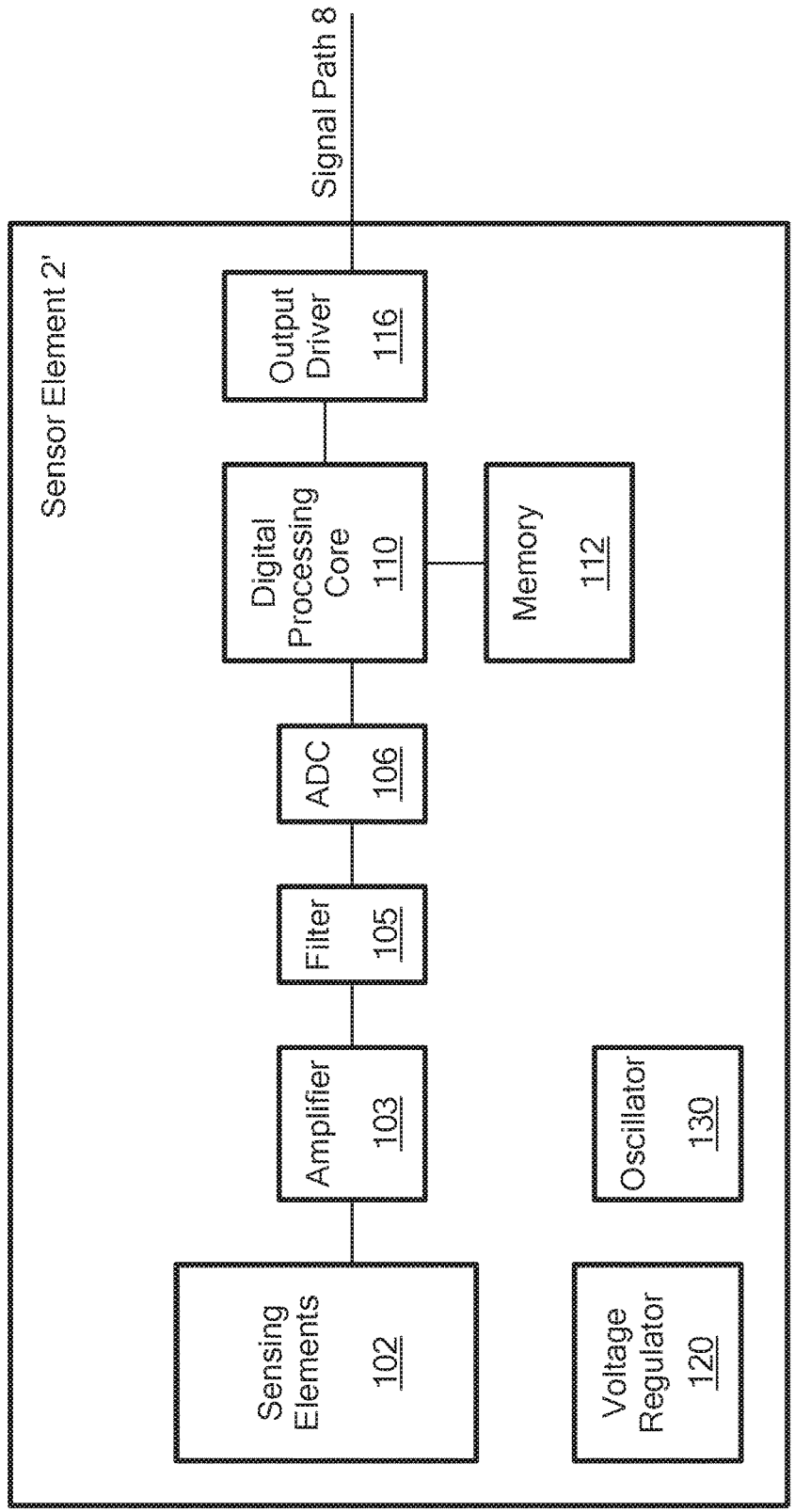
FIG. 1B is a block diagram of a sensor to generate a formatted output signal.
Figure 1C:
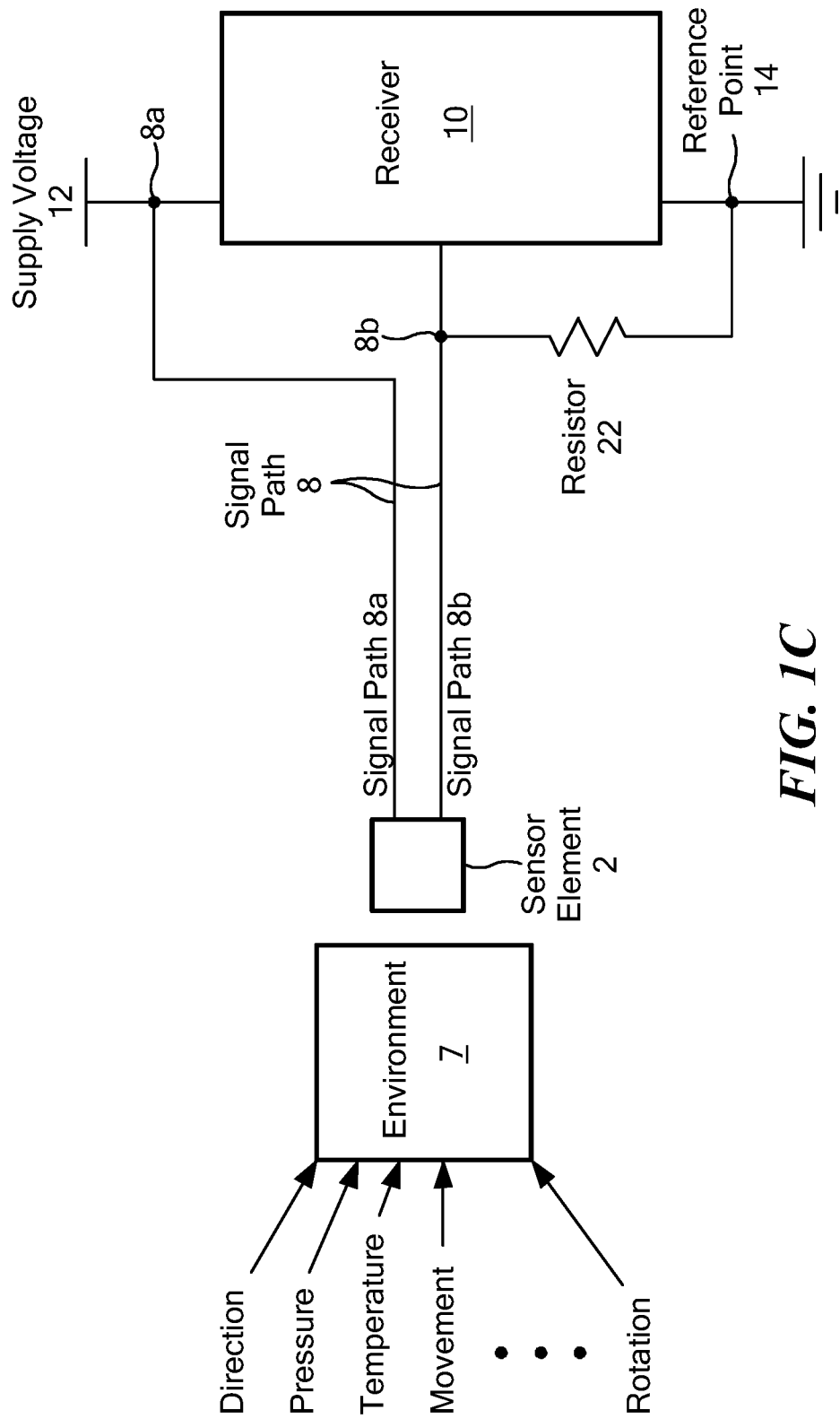
FIG. 1C is a block diagram of a system having a sensor disposed to sense properties of an environment around the sensor.

Referring briefly to FIG. 1C, the sensor 2 may sense different properties and characteristics of the environment 7 around the sensor 2. In an embodiment, the sensor 2 may be configured and/or reconfigured to detect one or more of a direction value, pressure value, temperature value, acceleration value, movement value, rotation value and so forth. In other embodiments, the sensor 2 is configured to detect a magnetic field variation in environment 7. The magnetic field variation may be used to detect a wide variety of different properties and characteristics of the environment 7 around the sensor 2. For example, the magnetic field variation may be used to detect a direction value, rotation value, angle value, speed value and so forth.

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

Referring back to FIG. 1A, in one embodiment, the sensor 2 can be positioned at varying distances and oriented at various angles relative to the target object 4 based upon the needs of a particular application. In some embodiments, the sensor 2 can be mounted at any angle in a plane perpendicular to a rotation of the target object 4. Sensor 2 may be positioned such that a plane of least one surface of the sensor 2 is parallel with a surface or edge of the target object 4. In one example, the sensor 2 is configured to generate an output signal pulse train in response to detecting characteristics and mechanical features (or more simply "features") of the target object 4.

Referring to FIG. 1B, one example of the sensor 2 is a sensor 2'. In one particular example, the sensor 2' is an integrated circuit (IC). The sensor 2' includes sensing elements 102, an amplifier 103, a filter 105, an analog-to-digital converter (ADC) 106, a digital processing core 110 with a memory 112 (e.g., EEPROM) and an output driver 116. The sensor 2' also includes a voltage regulator 120 and an oscillator 130.

In one example, a sensing element is a magnetic field sensing element. The term "magnetic field sensing element" is used herein, to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

In one particular example, the sensing elements 102 may include three Hall elements, where the Hall elements are positioned along edges or at vertices of an equilateral triangle within the sensor 2. In such an embodiment, each of the Hall elements sense the magnetic profile of the target object 4 simultaneously but at different locations.

The amplifier 103 boosts the signal(s) from the sensors 102 which are filtered by the filter 105. The ADC 106 converts analog signals from the filter 105 to digital signals and provides the digital signals to the digital processing core 110. In one example, the digital processing core 110 operates in parallel with the functionality of the sensor 2'. For example, the digital processing core 110 monitors for any diagnostic flags.

The digital processing core 110 may be a logic or state machine and may be configured to determine device state information and/or data bits. For example, the digital processing core 110 is configured to determine a logic value based on the signals received from the magnetic field sensing elements. The digital processing core 110 may be any computing device suitable for the execution of a computer program include, by way of example, both general and special purpose microprocessors, and any one or more processors of any kind of digital computer. Generally, the digital processing core 110 may also include, or be operatively coupled to receive data from or transfer data to, or both, one or more memory systems or mass storage devices for storing data, e.g., magnetic, magneto optical disks, or optical disks. The digital processing core 110 and the memory can be supplemented by, or incorporated in, special purpose logic circuitry.

The digital processing core 110 converts the digital data to analog signals that are provide to the output driver 116. In one particular example, the output driver 116 includes three current sources to provide three current levels, such as high, $I_{High}$; medium, $I_{Med}$; and low, $I_{Low}$.

Referring back to FIG. 1A, in the illustrative embodiment, the signal paths 8a, 8b couple the sensor 2 to the receiver 10, the supply voltage 12 and the reference point (e.g., ground) 14. In an embodiment, a first signal path 8a is coupled to the supply voltage 12 and the receiver 10 and a second signal path 8b is coupled to the receiver 10 and to the reference point 14 through a resistor 22.

The output signal pulse train generated by the sensor 2 propagates to the receiver 10 via one or both of the signal paths 8a, 8b. Thus, in some embodiments, the output signal pulse train propagates to receiver 10 via signal path 8b while in other embodiments, the output signal pulse train propagates to receiver 10 via signal path 8a.

The receiver 10 receives the pulse train provided thereto and in response thereto determines device state information and/or data bit values (or word values). In one embodiment, the receiver 10 identifies a first (or delimiter) pulse in the pulse train by detecting a particular pulse characteristic (e.g., pulse amplitude or pulse width or some other pulse characteristic) and then begins measuring pulse widths of the following (non-delimiter) pulses. As will be described in detail further below, the widths of both high and low pulses are used to convey information via the pulse train.

Figure 2:
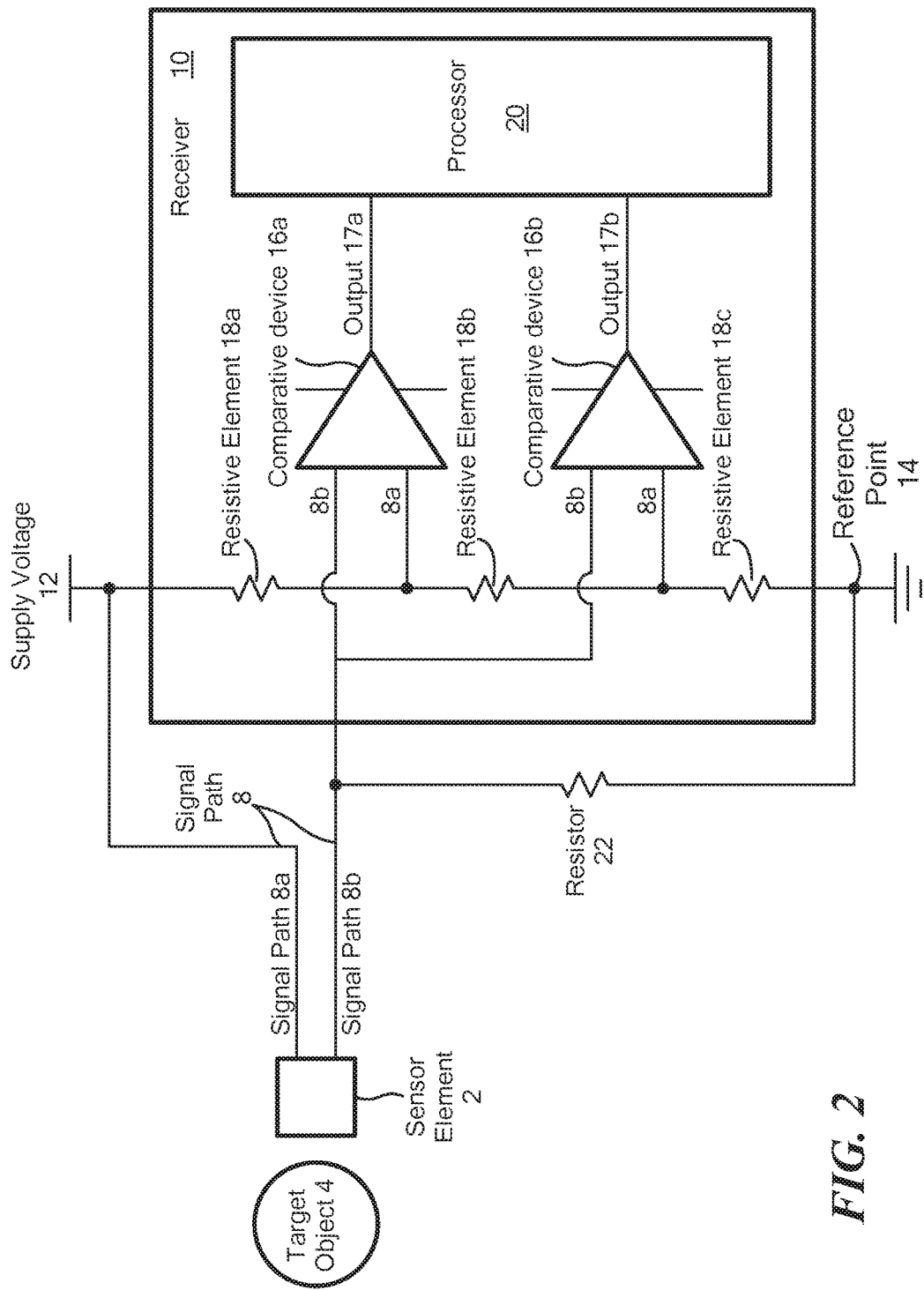
FIG. 2 is a circuit diagram of a system having a sensor and circuitry to detect the formatted output signal provided by the sensor.

Now referring to FIG. 2, a system illustrates the coupling between the sensor 2 and components of an illustrative receiver 10. The receiver 10 includes a pair of comparison devices (e.g. comparators) 16a, 16b and a processor 20 (e.g., state machine, digital block, controller and so forth). The comparison devices 16a, 16b have two inputs that are coupled to the sensor 2 through the signal paths 8. An output 17a, 17b of each of the comparison device 16a, 16b is coupled to the processor 20.

In one illustrative embodiment, the first signal path 8a couples the supply voltage 12 to a first input of the first comparison device 16a and the second comparison device 16b. While a pulse width pulse train such as that described in FIG. 1C is provided to the receiver 10 via the signal path 8b. The supply voltage 12 may provide a reference voltage to the first and second comparison devices 16a, 16b. To generate the reference voltage, the resistive elements 18a, 18b, 18c are disposed along the first signal path 8a between the supply voltage 12 and a first input of each of the first and second comparison devices 16a, 16b. In an embodiment, each resistive element 18a, 18b, 18c provides a voltage drop to generate and provide a predetermined reference voltage to the first and second comparison devices 16a, 16b.

For example, and as illustrated in FIG. 2, a first resistor 18a is disposed between the supply voltage 12 and first input of first comparison device 16a. A second resistor 18b is disposed between the first input of the first comparison device 16a and the first input of the second comparison device 16b. Sometimes the first and second comparison devices 16a, 16b are known as a window comparator. In other embodiments, more advanced circuit such as an ADC may be used in place of the window comparator.

A third resistor 18c is disposed between the first input of the second comparison device 16b and a reference point 14. Resistive elements 18a, 18b, 18c may be sized to various values according to a particular application and the properties of the components in a corresponding sensor system.

In an embodiment, the first and second comparison devices 16a, 16b compare the predetermined reference voltage to data output (i.e., an output signal pulse train) generated by the sensor 2. The data output may be transmitted in different forms, including as a current value, a voltage value or a RF signal. In an embodiment, the second signal path 8b provides data output (e.g., characteristics and features associated with the target object 4 and/or characteristics and features associated with sensor 2) from the sensor 2 to the first and second comparison devices 16a, 16b. As shown in FIG. 2, the second signal path 8b couples the sensor 2 to a second input of each of the first and second comparison devices 16a, 16b. In other embodiments, the first signal path 8a provides data output from the sensor 2 to the first and second comparison devices 16a, 16b and the second signal path 8b couples the supply voltage 12 to the first and second comparison device 16a, 16b.

In some embodiments, the second signal path 8b is coupled to ground (i.e., reference point 14) through a load resistor 22. The load resistor 22 is disposed between a node of the second signal path 8b and the reference point 14. The node of the second signal path 8b is disposed between the output of the sensor 2 and the second input of the first and second comparison devices 16a, 16b. The load resistor 22 may be used to modify or set an output value of the sensor 2 that is provided to the second input of the first and second comparison devices 16a, 16b to a predetermined level. For example, in some embodiments, the load resistor 22 provides a voltage drop corresponding to a product of an output of the sensor 2 and a value of the resistor 22. The load resistor 22 may be sized to various values according to a particular application and the properties of the components in a corresponding sensor system.

In FIG. 2, the comparison devices 16a, 16b are arranged to form a window comparator. However, it should be appreciated that comparators may be organized in other arrangements depending upon a particular application. The first and second comparison devices 16a, 16b compares two inputs (e.g., two voltages, two current, two radio frequency (RF) signals) and output a digital signal. Outputs of the first and second comparison devices 16a, 16b are coupled to the processor 20. The processor 20 can be configured to compare the output 17a of first comparison device 16a to the output 17b of second comparison device 16b.

The processor 20 may be a logic or state machine and be configured to receive the outputs 17a, 17b and determine device state information and/or data bits. For example, the processor 20 is configured to determine a logic value for each of the measured widths. The processor 20 may be any computing device suitable for the execution of a computer program include, by way of example, both general and special purpose microprocessors, and any one or more processors of any kind of digital computer. Generally, the processor 20 can also include, or be operatively coupled to receive data from or transfer data to, or both, one or more memory systems or mass storage devices for storing data, e.g., magnetic, magneto optical disks, or optical disks. The processor 20 and the memory can be supplemented by, or incorporated in, special purpose logic circuitry.

Figure 3A:
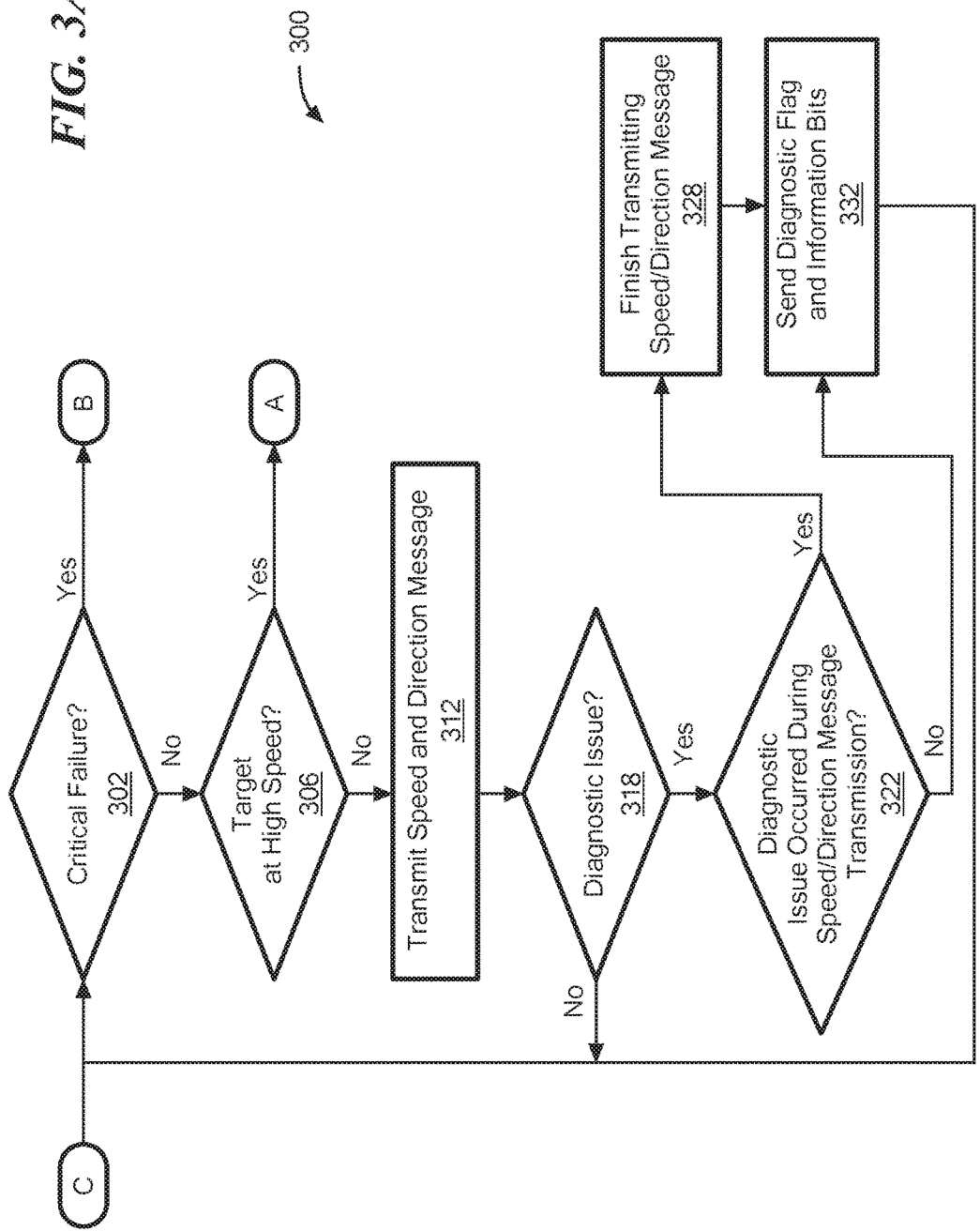
FIGS. 3A to 3C is a flowchart of an example of a process to format an output signal.
Figure 3B:
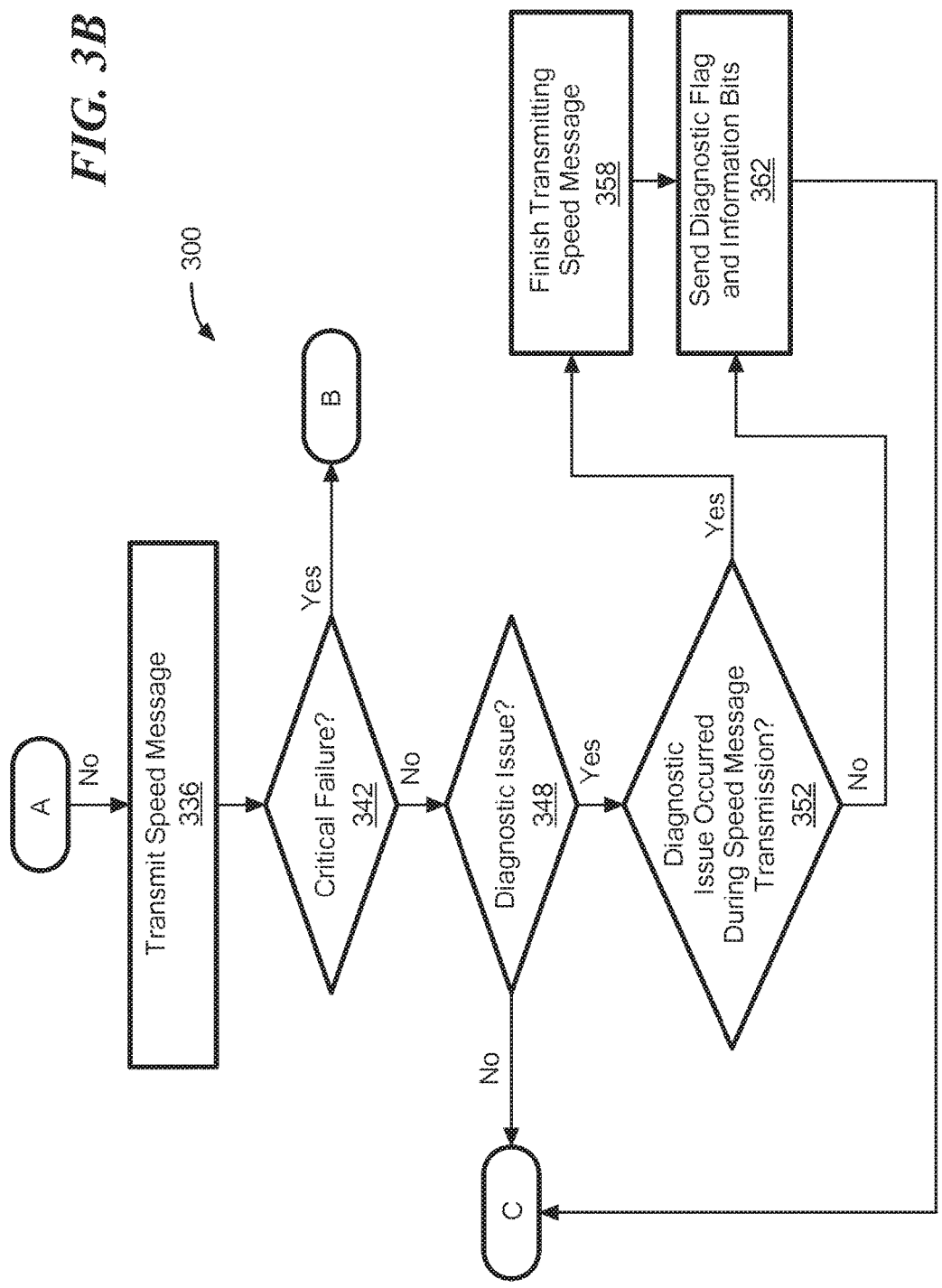
Figure 3C:
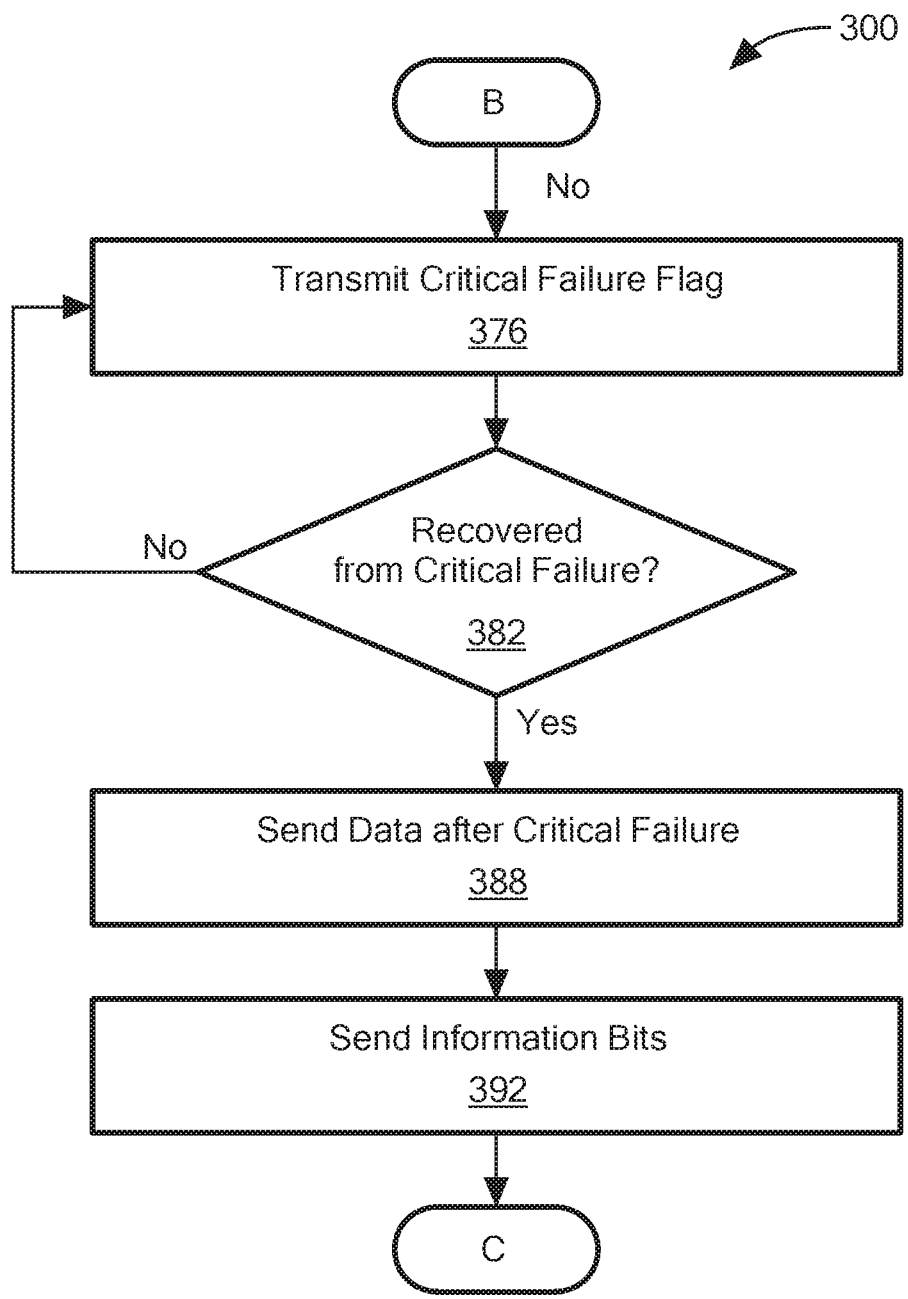

Referring to FIGS. 3A to 3C, an example of a process to format an output (e.g., a signal path 8a or signal path 8b) is a process 300. In one particular example, the process 300 is performed by the digital processing core 110.

Process 300 determines if there is a critical failure (302). For example, the digital processing core 110 determines if there is a critical failure.

If there is not a critical failure, process 300 determines if the target is moving at a high speed (306). For example, the digital processing core 110 determines if the target object 4 is turning faster than 1 kHz.

If the target is not at a high speed, process 300 transmits speed and direction (312). Process determines if there is a diagnostic issue (318). If there is not a diagnostic issue, process 300 repeats processing block 302.

If there is a diagnostic issue, process 300 determines if the diagnostic issue occurred during the speed/direction message (322). If the diagnostic occurred during the speed/direction message, process 300 finishes transmitting the speed/direction message (328). Process 300 sends a diagnostic flag and information bits (332). If the diagnostic occurred before or after the speed/direction message, process 300 sends a diagnostic flag and information bits (332). Process 300 repeats processing block 302.

If the target is at high speed, process 300 transmits the speed message (336). For example, the digital processing core 110 determines if the target object 4 is turning faster than 1 kHz. In another example, the digital processing core 110 determines if the target object 4 is turning faster than 1 kHz but less than or equal to 10 kHz.

Process 300 determines if there is a critical failure (342). If there is not a critical failure, process determines if there is a diagnostic issue (348). If there is not a diagnostic issue, process 300 repeats processing block 302.

If there is a diagnostic issue, process 300 determines if the diagnostic issue occurred during the speed message (352). If the diagnostic occurred during transmission of the speed message, process 300 finishes transmitting the speed message (358). Process 300 sends a diagnostic flag and information bits (362). If the diagnostic occurred before or after the speed/direction message, process 300 sends a diagnostic flag and information bits (332). Process 300 repeats processing block 302.

If there is a critical failure, process 300 transmits a critical failure flag (376). Process 300 determines if there has been a recovery from the critical failure (382). If there has not been a recovery, process 300 repeats processing blocks 376 and 382.

If there has been a recovery from the failure, process 300 sends data received after critical failure (388) and send the information bits (392).

Figure 4A:
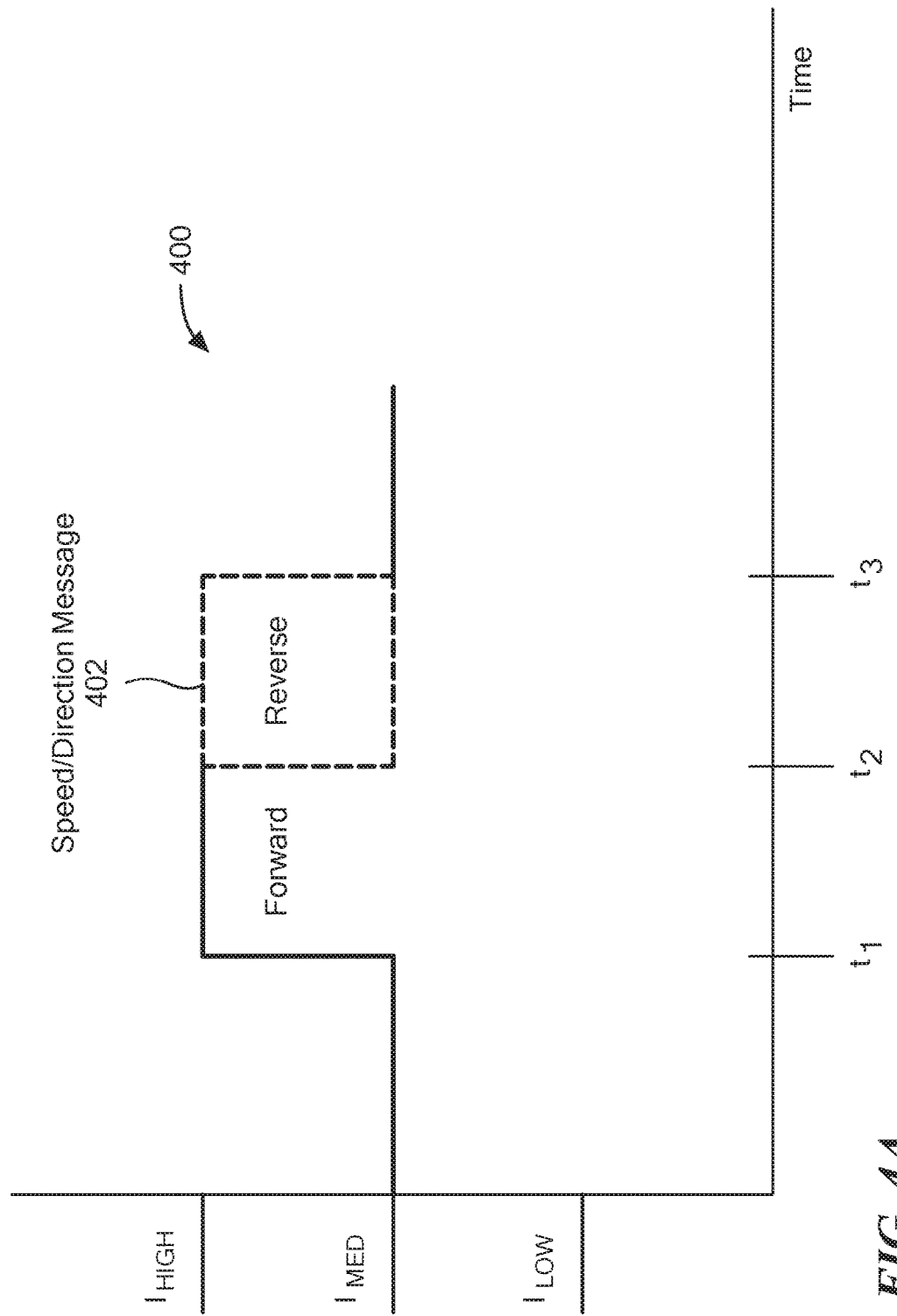

FIG. 4A depicts a timing window 400 for low speed without any diagnostic faults or critical faults. In one example, a low speed is when the target has a speed less than or equal to 1 kHz. The timing window 400 includes a speed/direction message 402. Since there are no critical or diagnostic fault, only speed and direction are transmitted. The speed/direction pulse information is transmitted when the speed/direction message 402 transitions from $I_{Med}$ to $I_{High}$ and when the speed/direction message 402 transitions from $I_{High}$ back to $I_{Med}$. The speed is determined from two speed pulse edge to edge timing. The direction is measured from the speed pulse's pulse width. In one particular example, if the pulse is $t_3-t_1$ in duration, the target object 4 is turning in a reverse direction and if the pulse is $t_2-t_1$ in duration the target object 4 is turning in the forward direction.

Figure 4B:
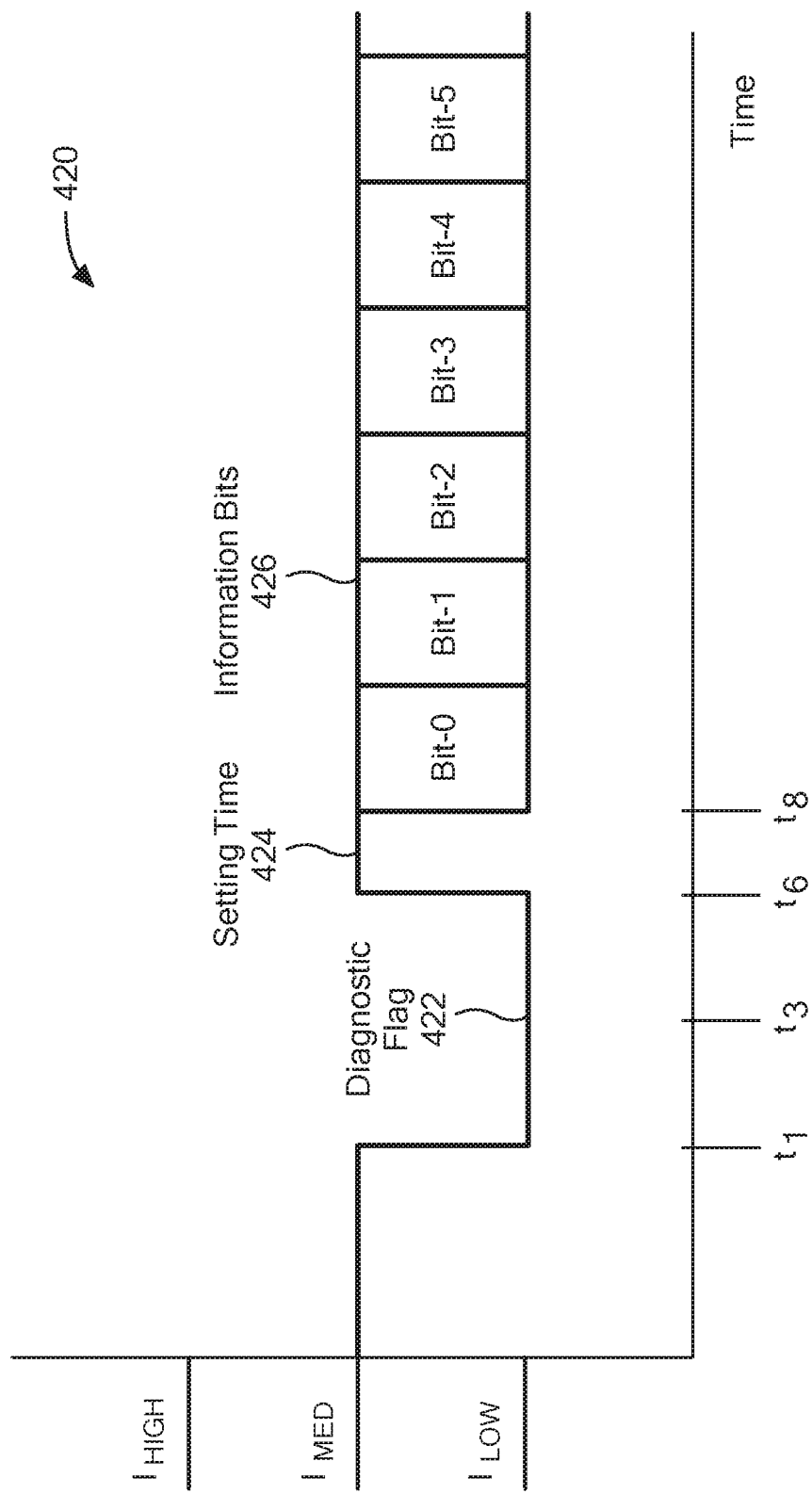

FIG. 4B depicts a timing window 420 for low speed when a diagnostic fault is detected before a speed/direction pulse is sent. No speed/direction is transmitted. In one particular example, the diagnostic flag 422 is transmitted going from $I_{Med}$ to $I_{Low}$ and from $I_{Low}$ to $I_{Med}$. In one particular example, the diagnostic flag 422 has a $t_6-t_1$ time duration. After a settling time 424 (e.g., $t_8-t_6$ time duration), the information bits 426 are transmitted. In one example, a diagnostic flag has a duration of 250 microseconds.

FIG. 4C depicts a timing window 440 for low speed when a diagnostic fault is detected during a speed/direction pulse transmission. The speed/direction pulse 402 is transmitted first (e.g., going from $I_{Med}$ to $I_{High}$ and from $I_{High}$ to $I_{Med}$) and then the diagnostic flag 422 (e.g., going from $I_{Med}$ to $I_{Low}$ and from $I_{Low}$ to $I_{Med}$). The information bits 426 are transmitted after a settling time 424.

Figure 5A:
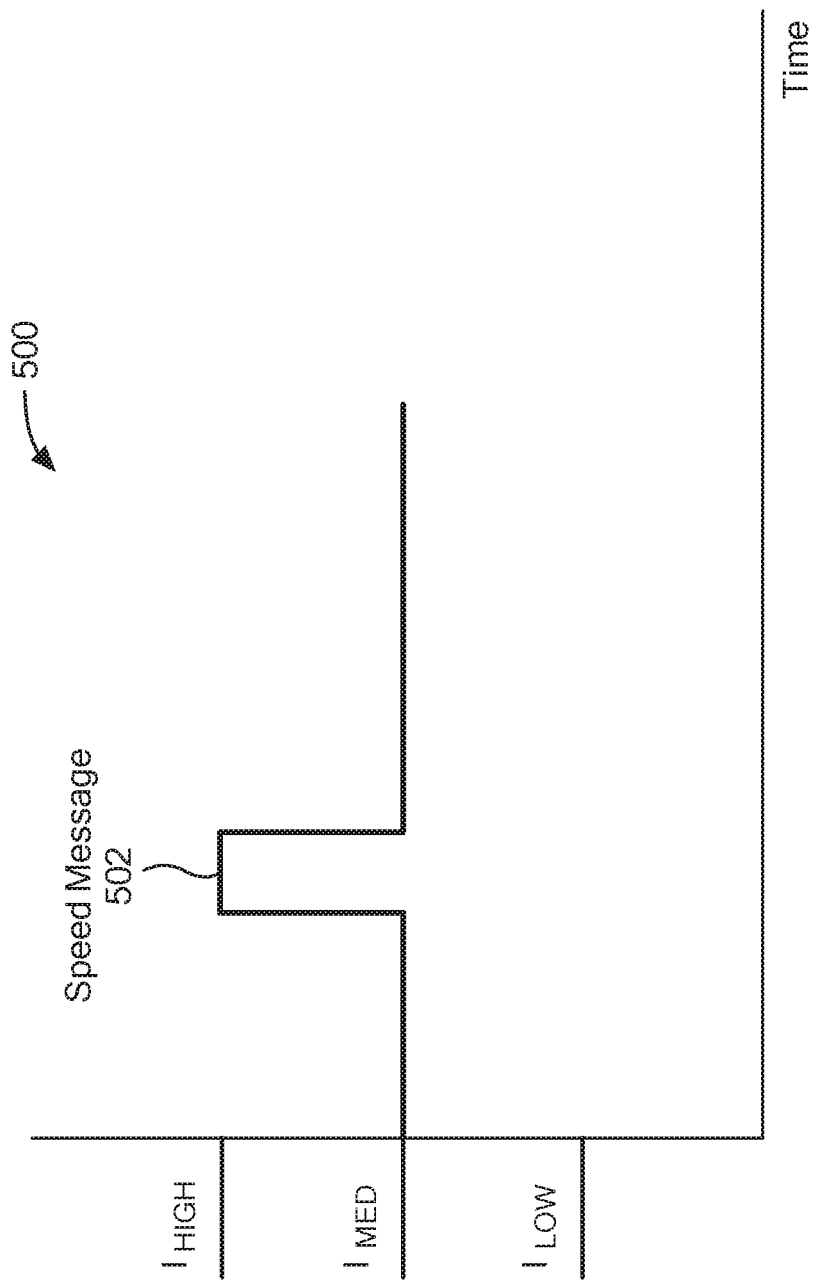
FIGS. 5A to 5C are timing windows when a target object is at a high speed.

FIG. 5A depicts a timing window 500 for high speed without any diagnostic faults or critical faults. In one example, a high speed is when the target has a speed greater than 1 kHz. In another example, a high speed is when the target has a speed greater than 1 kHz but less than or equal to 10 kHz. The timing window 500 includes a speed/direction message 502. Since there are no critical or diagnostic fault, only the speed pulse 502 is transmitted. The speed/direction pulse information is transmitted when the speed/direction message 502 transitions from $I_{Med}$ to $I_{High}$ and when the speed/direction message 502 transitions from $I_{High}$ back to $I_{Med}$.

Figure 5B:
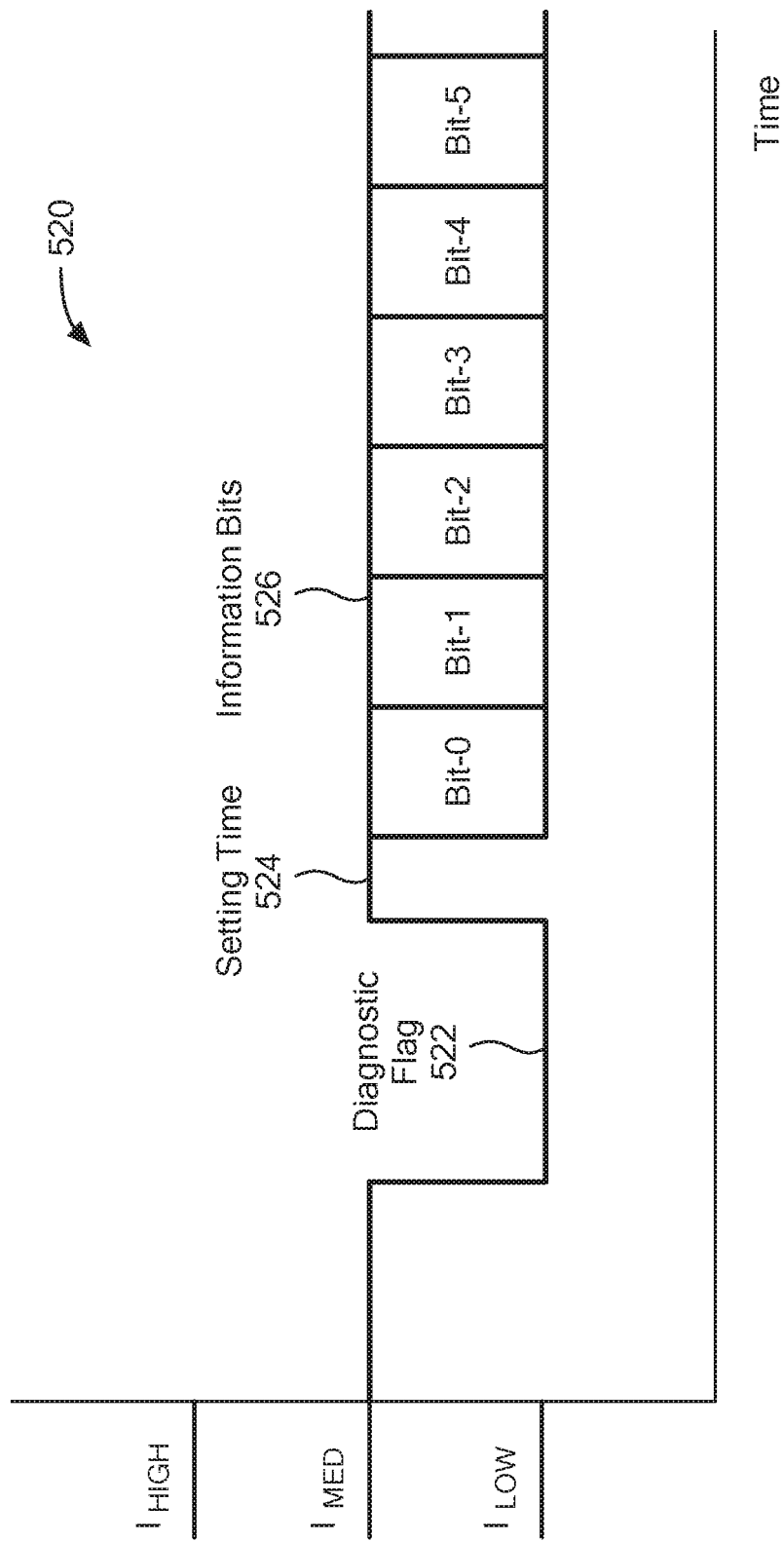

FIG. 5B depicts a timing window 520 for high speed when a diagnostic fault is detected before a speed pulse is sent. No speed pulse is transmitted. In one particular example, the diagnostic flag 522 is transmitted going from $I_{Med}$ to $I_{Low}$ and from $I_{Low}$ to $I_{Med}$. After a settling time 524, the information bits 526 are transmitted.

Figure 5C:
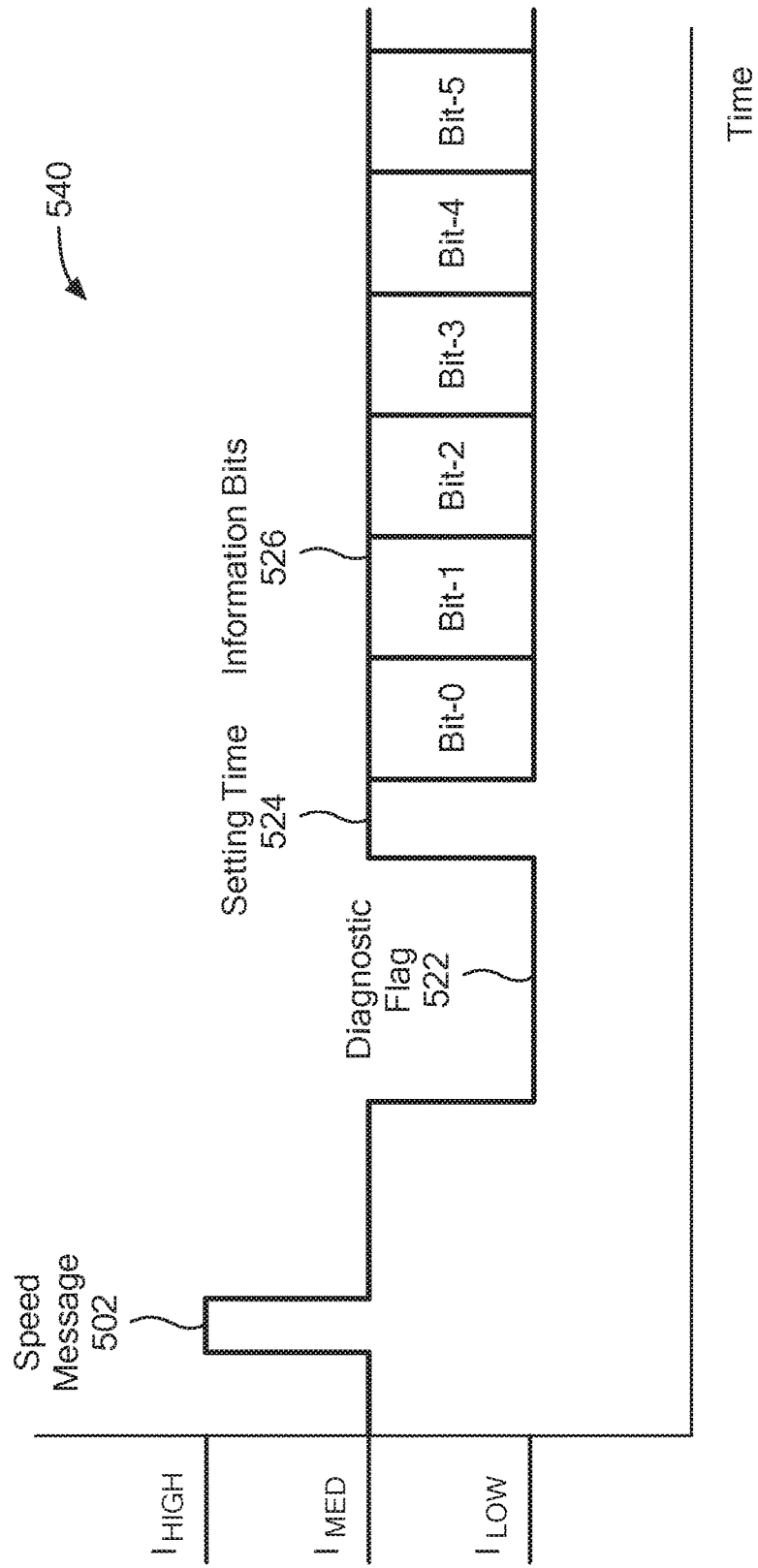

FIG. 5C depicts a timing window 540 for high speed when a diagnostic fault is detected during a speed pulse transmission. The speed pulse 502 is transmitted first (e.g., going from $I_{Med}$ to $I_{High}$ and from $I_{High}$ to $I_{Med}$) and then the diagnostic flag 522 (e.g., going from $I_{Med}$ to $I_{Low}$ and from $I_{Low}$ to $I_{Med}$). The information bits 526 are transmitted after a settling time 524.

Figure 6:
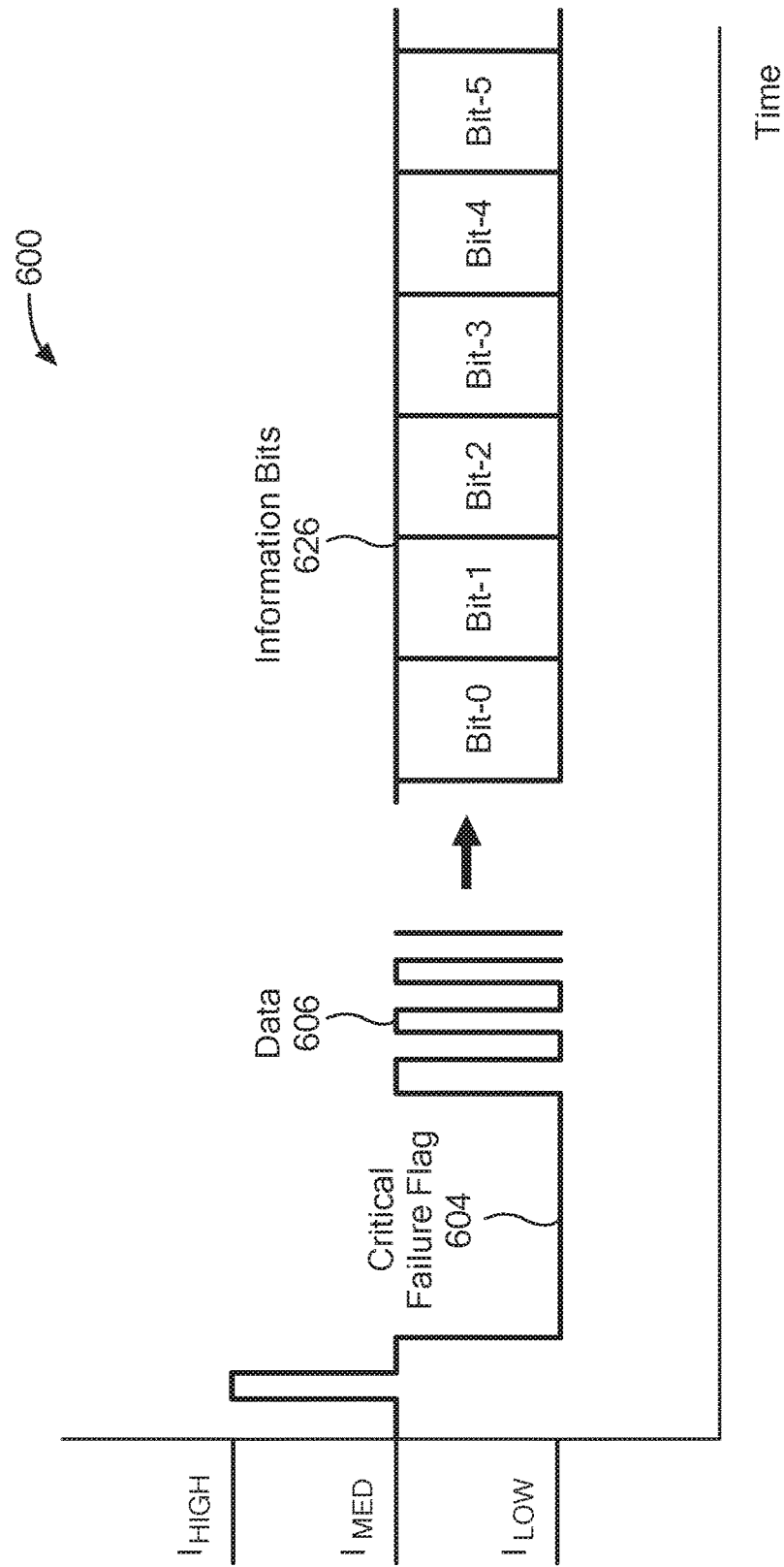
FIG. 6 is a timing window after a critical failure and recovery.

FIG. 6 depicts a timing window 600 after critical failure and recovery. In one particular example, the critical failure flag 604 is transmitted going from $I_{Med}$ to $I_{Low}$. After recovery, data 606 is sent followed by the information bits 626.

Figures 7A, 7B:
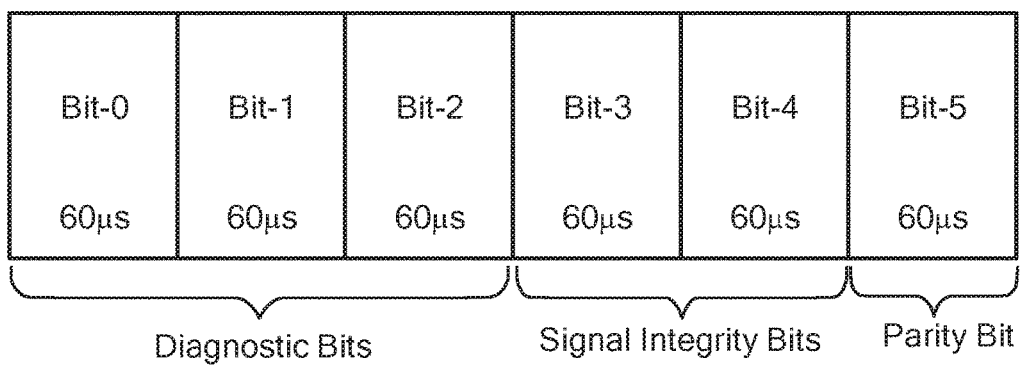
FIG. 7A is diagram of one example of information bits.
FIG. 7B are tables of examples of what the information bits may indicate.

FIG. 7A depicts one example of information bits that may be used such as diagnostic bits, integrity bits and a parity bit. In this particular example, there are three diagnostic bits followed by two system integrity bits followed by one parity bit. In this particular example, each bit has a duration of 60 microseconds.

FIG. 7B depicts an example of a table 720 denoting diagnostic bits (e.g., three diagnostic bits). In this particular example, diagnostic bits 0, 0, 0 means no error detected; diagnostic bits 0, 0, 1 indicates a first safety goal (safety goal 1) is not being achieved; diagnostic bits 0, 1, 0 indicates a second safety goal (safety goal 2) is not being achieved; diagnostic bits 1, 0, 0 indicates a third safety goal (safety goal 3) is not being achieved; and diagnostic bits 1, 1, 1 is reserved to indicate something not yet designated.

In one particular example, the safety goal 1 indicates that a number of pulses received is too few (i.e., below a required minimum of pulses). In another particular example, the safety goal 2 indicates that a number of pulses received is too many (i.e., above a required maximum of pulses). In a further example, the safety goal 3 indicates that an invalid direction has been detected.

FIG. 7B also depicts an example of a table 740 tables denoting system integrity bits (e.g., two system integrity bits). In this particular example, system integrity bits 0, 0 means no issue detected; system integrity bits 0, 1 indicates there is a marginal signal issue detected; system integrity bits 1, 0 indicates there is an at signal limit issue detected; and system integrity bits 1, 1 indicates there is a vibration flag issue detected.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. The term "module" is sometimes used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

The processes (e.g., processes 300) described herein may be implemented in hardware, software, or a combination of the two. The processes described herein may be implemented in computer programs executed on programmable computers/machines that each includes a processor, a non-transitory machine-readable medium or other article of manufacture that is readable by the processor (including volatile and non-volatile memory and/or storage elements), at least one input device, and one or more output devices. Program code may be applied to data entered using an input device to perform any of the processes described herein and to generate output information.

The system may be implemented, at least in part, via a computer program product, (e.g., in a non-transitory machine-readable storage medium such as, for example, a non-transitory computer-readable medium), for execution by, or to control the operation of, data processing apparatus (e.g., a programmable processor, a computer, or multiple computers). Each such program may be implemented in a high level procedural or object-oriented programming language to work with the rest of the computer-based system. However, the programs may be implemented in assembly, machine language, or Hardware Description Language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a non-transitory machine-readable medium that is readable by a general or special purpose programmable computer for configuring and operating the computer when the non-transitory machine-readable medium is read by the computer to perform the processes described herein. For example, the processes described herein may also be implemented as a non-transitory machine-readable storage medium, configured with a computer program, where upon execution, instructions in the computer program cause the computer to operate in accordance with the processes. A non-transitory machine-readable medium may include but is not limited to a hard drive, compact disc, flash memory, non-volatile memory, volatile memory, magnetic diskette and so forth but does not include a transitory signal per se.

The processes described herein are not limited to the specific examples described. For example, the process 300 is not limited to the specific processing order of FIGS. 3A to 3C respectively. Rather, any of the processing blocks of FIGS. 3A to 3C may be re-ordered, combined or removed, performed in parallel or in serial, as necessary, to achieve the results set forth above.

The processing blocks (for example, in the process 300) associated with implementing the system may be performed by one or more programmable processors executing one or more computer programs to perform the functions of the system. All or part of the system may be implemented as, special purpose logic circuitry (e.g., an FPGA (field-programmable gate array) and/or an ASIC (application-specific integrated circuit)). All or part of the system may be implemented using electronic hardware circuitry that include electronic devices such as, for example, at least one of a processor, a memory, programmable logic devices or logic gates.

Elements of different embodiments described herein may be combined to form other embodiments not specifically set forth above. Various elements, which are described in the context of a single embodiment, may also be provided separately or in any suitable subcombination. Other embodi-

What is claimed is:

1. An integrated circuit (IC) comprising:
a sensor comprising a processor configured to:
provide speed information of a target object in response to a speed of the target object being greater than a first predetermined value;
provide the speed information and direction information of the target object in response to the speed being below the first predetermined value;
monitor for a diagnostic fault;
provide a diagnostic flag and information bits in response to the diagnostic fault being detected;
monitor for a critical fault; and
provide the information bits in response to the critical fault being detected and in response to the sensor recovering from the critical fault,
wherein the processor configured to provide the diagnostic flag and the information bits in response to the diagnostic fault being detected comprises the processor configured to finish providing the speed information before providing the diagnostic flag and the information bits in response to the diagnostic fault occurring during transmission of the speed information.

2. The IC of claim 1, wherein the processor configured to provide the speed information of the target object in response to the speed of the target object being greater than the first predetermined speed comprises the processor configured to provide the speed information of the target object in response to the speed of the target object being greater than the first predetermined speed and less than a second predetermined speed.

3. The IC of claim 2, wherein the first predetermined speed is 1 kHz and the second predetermined speed is 10 kHz.

4. The IC of claim 1, wherein the information bits comprise diagnostic bits, system integrity bits and a parity bit.

5. The IC of claim 1, wherein the information bits comprise at least one of a diagnostic bit, a system integrity bit or a parity bit.

6. The IC of claim 1, wherein the processor configured to provide the speed information of the target object in response to the speed of the target object being greater than the first predetermined value comprises providing the speed information without providing the direction information.

7. The IC of claim 1, wherein the processor comprises a magnetic field sensing element.

8. The IC of claim 7, wherein the magnetic field sensing element comprises a Hall effect element, a magnetoresistance element or a magnetotransistor.

9. The IC of claim 8, wherein the magnetoresistance element comprises a giant magnetoresistance (GMR) element, an anisotropic magnetoresistance element (AMR), a tunneling magnetoresistance (TMR) element or a magnetic tunnel junction (MTJ).

10. An integrated circuit (IC) comprising:
a sensor comprising a processor configured to:
provide speed information of a target object in response to a speed of the target object being greater than a first predetermined value;
provide the speed information and direction information of the target object in response to the speed being below the first predetermined value;
monitor for a diagnostic fault;
provide a diagnostic flag and information bits in response to the diagnostic fault being detected;
monitor for a critical fault; and
provide the information bits in response to the critical fault being detected and in response to the sensor recovering from the critical fault,
wherein the processor configured to provide the diagnostic flag and the information bits in response to the diagnostic fault being detected comprises
the processor configured to finish providing the speed information and the direction information before providing the diagnostic flag and the information bits in response to the diagnostic fault occurring during transmission of speed information and the direction information.

11. The IC of claim 10, wherein the processor configured to provide the speed information of the target object in response to the speed of the target object being greater than the first predetermined value comprises providing the speed information without providing the direction information.

12. The IC of claim 10, wherein the processor configured to provide the speed information of the target object in response to the speed of the target being greater than the first predetermined speed comprises the processor configured to provide the speed information of the target in response to the speed of the target object being greater than the first predetermined speed and less than a second predetermined speed.

13. The IC of claim 12, wherein the first predetermined speed is 1 kHz and the second predetermined speed is 10 kHz.

14. The IC of claim 10, wherein the information bits comprise diagnostic bits, system integrity bits and a parity bit.

15. The IC of claim 10, wherein the information bits comprise at least one of a diagnostic bit, a system integrity bit or a parity bit.

16. The IC of claim 10, wherein the processor comprises a magnetic field sensing element.

17. The IC of claim 16, wherein the magnetic field sensing element comprises a Hall effect element, a magnetoresistance element or a magnetotransistor.

18. The IC of claim 17, wherein the magnetoresistance element comprises a giant magnetoresistance (GMR) element, an anisotropic magnetoresistance element (AMR), a tunneling magnetoresistance (TMR) element or a magnetic tunnel junction (MTJ).

19. A method comprising:
providing speed information of a target object in response to a speed of the target object being greater than a first predetermined value;
providing the speed information and direction information of the target object in response to the speed being below the first predetermined value;
monitoring for a diagnostic fault;
providing a diagnostic flag and information bits in response to the diagnostic fault being detected;
monitoring for a critical fault; and
providing a critical flag and the information bits in response to the critical fault being detected and in response to a sensor recovering from the critical fault,
wherein providing the diagnostic flag and the information bits in response to the diagnostic fault being detected comprises finishing providing the speed information before providing the diagnostic flag and the information bits in response to the diagnostic occurring during transmission of speed information.

20. The method of claim 19, wherein providing the speed information of the target object in response to the speed of the target object being greater than the first predetermined speed comprises providing the speed information of the target object in response to the speed of the target object being greater than the first predetermined speed and less than a second predetermined speed.

21. The method of claim 20, wherein the first predetermined speed is 1 kHz and the second predetermined speed is 10 kHz.

22. The method of claim 19, wherein the information bits comprise diagnostic bits, system integrity bits and a parity bit.

23. The method of claim 19, wherein the information bits comprise at least one of a diagnostic bit, a system integrity bit or a parity bit.

24. The method of claim 19, providing the speed information of the target object in response to the speed of the target object being greater than the first predetermined value comprises providing the speed information without providing the direction information.

25. A method comprising:
  providing speed information of a target object in response to a speed of the target object being greater than a first predetermined value;
  providing the speed information and direction information of the target object in response to the speed being below the first predetermined value;
  monitoring for a diagnostic fault;
  providing a diagnostic flag and information bits in response to the diagnostic fault being detected;
  monitoring for a critical fault; and
  providing a critical flag and the information bits in response to the critical fault being detected and in response to a sensor recovering from the critical fault,
  wherein providing the diagnostic flag and the information bits in response to the diagnostic fault being detected comprises
  finishing providing the speed information and the direction information before providing the diagnostic flag and the information bits in response to if the diagnostic fault occurring during transmission of speed information and the direction information.

26. The method of claim 25, providing the speed information of the target object in response to the speed of the target object being greater than the first predetermined value comprises providing the speed information without providing the direction information.

27. The method of claim 25, wherein providing the speed information of the target object in response to the speed of the target object being greater than the first predetermined speed comprises providing the speed information of the target object in response to the speed of the target object being greater than the first predetermined speed and less than a second predetermined speed.

28. The method of claim 27, wherein the first predetermined speed is 1 kHz and the second predetermined speed is 10 kHz.

29. The method of claim 25, wherein the information bits comprise diagnostic bits, system integrity bits and a parity bit.

30. An integrated circuit (IC) comprising:
  a sensor comprising a means to:
    provide speed information of a target object in response to a speed of the target object being greater than a first predetermined value;
    provide the speed information and direction information of the target object in response to the speed being below the first predetermined value;
    monitor for a diagnostic fault;
    provide a diagnostic flag and information bits in response to the diagnostic fault being detected;
    monitor for a critical fault; and
    provide the information bits in response to the critical fault being detected and in response to the sensor recovering from the critical fault,
  wherein the means to provide the diagnostic flag and the information bits in response to the diagnostic fault being detected comprises the means to finish providing the speed information before providing the diagnostic flag and the information bits in response to the diagnostic fault occurring during transmission of the speed information.

31. The IC of claim 30, wherein the sensor comprises a giant magnetoresistance (GMR) element, an anisotropic magnetoresistance element (AMR), a tunneling magnetoresistance (TMR) element, a magnetic tunnel junction (MTJ) or a Hall effect element.

32. An integrated circuit (IC) comprising:
  a sensor comprising a means to:
    provide speed information of a target object in response to a speed of the target object being greater than a first predetermined value;
    provide the speed information and direction information of the target object in response to the speed being below the first predetermined value;
    monitor for a diagnostic fault;
    provide a diagnostic flag and information bits in response to the diagnostic fault being detected;
    monitor for a critical fault; and
    provide the information bits in response to the critical fault being detected and in response to the sensor recovering from the critical fault,
  wherein providing the diagnostic flag and the information bits in response to the diagnostic fault being detected comprises finishing providing the speed information and the direction information before providing the diagnostic flag and the information bits in response to the diagnostic fault occurring during transmission of speed information and the direction information.

33. The IC of claim 32, wherein the sensor comprises a giant magnetoresistance (GMR) element, an anisotropic magnetoresistance element (AMR), a tunneling magnetoresistance (TMR) element, a magnetic tunnel junction (MTJ) or a Hall effect element.

* * * * *

UNITED STATES PATENT AND TRADEMARK OFFICE
CERTIFICATE OF CORRECTION

| | |
|---|---|
| PATENT NO. | : 10,481,218 B2 |
| APPLICATION NO. | : 15/695109 |
| DATED | : November 19, 2019 |
| INVENTOR(S) | : Seth Prentice et al. |

It is certified that error appears in the above-identified patent and that said Letters Patent is hereby corrected as shown below:

In the Specification

Column 2, Line 17, delete "is diagram" and replace with --is a diagram--.

Column 2, Line 58, delete "multiple levels diagnostic errors," and replace with --multiple levels of diagnostic errors,--.

Column 8, Line 16, delete "send the" and replace with --sends the--.

Column 10, Line 59, delete "include" and replace with --includes--.

Signed and Sealed this
Fourth Day of August, 2020

Andrei Iancu
*Director of the United States Patent and Trademark Office*